(12) United States Patent
Lee et al.

(10) Patent No.: US 6,756,924 B2
(45) Date of Patent: Jun. 29, 2004

(54) CIRCUIT AND METHOD FOR DC OFFSET CALIBRATION AND SIGNAL PROCESSING APPARATUS USING THE SAME

(75) Inventors: Junghwan Lee, Seongnam-si (KR); Bo-Eun Kim, Yongin-si (KR); Jinkyu Lim, Seongnam-si (KR); Minsu Jeong, Anyang-si (KR); Bonkee Kim, Yongin-si (KR)

(73) Assignee: Integrant Technologies Inc., Kyunggi-do (KR)

( * ) Notice: Subject to any disclaimer, the term of this patent is extended or adjusted under 35 U.S.C. 154(b) by 0 days.

(21) Appl. No.: 10/438,941

(22) Filed: May 16, 2003

(65) Prior Publication Data

US 2003/0214423 A1 Nov. 20, 2003

(51) Int. Cl.⁷ .................................................. H03M 1/10
(52) U.S. Cl. ........................ 341/120; 341/118; 341/122; 330/9; 330/2; 327/307
(58) Field of Search ............................... 341/120, 118, 341/122; 330/9, 2; 455/255, 63

(56) References Cited

U.S. PATENT DOCUMENTS

| 4,282,515 | A | * | 8/1981 | Patterson, III | 341/118 |
|---|---|---|---|---|---|
| 4,488,144 | A | * | 12/1984 | Wollman | 341/118 |
| 4,495,470 | A | * | 1/1985 | Bristol | 330/9 |
| 5,087,914 | A | * | 2/1992 | Sooch et al. | 341/118 |
| 5,153,592 | A | * | 10/1992 | Fairchild et al. | 341/118 |
| 5,397,944 | A | * | 3/1995 | DuPuis | 327/307 |
| 6,049,246 | A | | 4/2000 | Kozisek et al. | |
| 6,114,980 | A | * | 9/2000 | Tilley et al. | 341/118 |
| 6,166,668 | A | * | 12/2000 | Bautista et al. | 341/118 |
| 6,225,848 | B1 | * | 5/2001 | Tilley et al. | 327/307 |
| 6,317,064 | B1 | * | 11/2001 | Ferrer et al. | 341/118 |
| 6,356,217 | B1 | * | 3/2002 | Tilley et al. | 341/118 |
| 6,356,218 | B1 | * | 3/2002 | Brown et al. | 341/120 |
| 6,360,087 | B1 | | 3/2002 | Rozenblit et al. | |
| 6,459,889 | B1 | | 10/2002 | Ruelke | |
| 6,642,868 | B1 | * | 11/2003 | Brown et al. | 341/120 |

FOREIGN PATENT DOCUMENTS

EP 1 107 459 A2 6/2001

OTHER PUBLICATIONS

Jacques C. Rudell "HIgh–Integration, High–Selectivity CMOS Receivers for Multi–Standard Applications" Oct. 4ᵗʰ, 2000, pp. 1–41, University of California at Berkeley, U.S.A.
Satoshi Tanaka, Taizo Yamawaki, Kumiko Takikawa, Norio Hayashi, Ikuo Ohno, Tetsuya Wakauta, Satoru Takahashi, and Masumi Kasahara "GSM/DCS1800 Dual Band Direct–Conversion Transceiver IC With a DC Offset Calibration system" ESSCIRC2001.

(List continued on next page.)

*Primary Examiner*—Michael Tokar
*Assistant Examiner*—Lam T. Mai
(74) *Attorney, Agent, or Firm*—Shinjyu Global IP Counselors, LLP

(57) ABSTRACT

A signal processing apparatus for correcting DC offset in a communication system is provided. The signal processing apparatus comprises: a low noise amplifier (LNA) 301; a mixer 303 for mixing the output from said LNA 301 with local oscillation signal LO; a first offset correction amplifier 305 for amplifying output signal from said mixer 303 and for eliminating DC offset in the output signal in accordance with first control signal Vc31; a second offset correction amplifier 309 for amplifying output signal from said first offset correction amplifier 305 and for eliminating DC offset in the output signal in accordance with second control signal Vc32; a variable gain amplifier 311 for amplifying output from said second offset correction amplifier 309 wherein gain is controlled such that power level of output be maintained to a desired value; offset calibration mean 313 for calibrating DC offset in output from said variable gain amplifier 311; and offset correction mean 315 for outputting the first and second control signals Vc31 and Vc32 in accordance with the output from said offset calibration mean 313, to eliminate DC offset in the output from said variable gain amplifier 311.

22 Claims, 12 Drawing Sheets

OTHER PUBLICATIONS

Stephen Dow, Brian Ballweber, Ling–Miao Chou, David Eickbusch, Jim Irwin, Gary Kurtzman, Praveen Manapragada, David Moeller, Jeyanandh Paramesh, Greg Black, Robert Wollscheid, Ken Johnson "A Dual–Band Direct–Conversion/VLIF Transceiver for 50GSM/GSM/DSC/PCS", ISSCC2002 / Session 14 / Cellular RF Wireless / 14.1 ISSCC 2002 Visuals Supplement 2002 pp. 182–183& p. 462.

Alyosha Molnar, Rahul Magoon, Geoffrey Hatcher, Jeffrey Zachan, Woogeun Rhee, Morten Damgaard, William Domino, Nooshin Vakilian "A Single–Chip Quad–Band(850/900/1800/1900MHz) Direct–Conversion GSM/GPRS RF Transceiver with Integrated VCOs and Fractional–N Synthesizer", ISSCC2002 / Session 14 / Cellular RF Wireless / 14.2 ISSCC 2002 / Feb. 5, 2002 / Salon 8 / 2:00 PM.

I Bouras, S. Bouras, T. Georgantas, N. Haralabidis, G. Kamoulakos, C. Kapnistis, S.Kavadias, Y. Kokolakis, P. Merakos, J. Rudell, S. Plevridis, I. Vassiliou, K. Vavelidis, A. Yamanaka "A Digitally Calibrated 5.15—5.825GHz Transceiver for 802. 11a Wireless LANs in 0.18 $\mu$m CMOS", ISSCC2003 / Session 20 / Wireless Local Area Networking / Paper 20.2 pp. 352–353 2003 IEEE International Solid–State Circuits Conference.

* cited by examiner

CIRCUIT AND METHOD FOR DC OFFSET CALIBRATION AND SIGNAL PROCESSING APPARATUS USING THE SAME

TECHNICAL FIELD

The present invention relates to communication systems and, more particularly, circuit for correcting DC offset and signal processing apparatus using thereof.

BACKGROUND OF THE INVENTION

Direct conversion receiver has been developed and applied for many years. In the direct conversion receiver, an input radio signal is down converted to a base band signal without being converted to intermediate frequency (IF) signal. If direct conversion receiver is used, the number of exterior devices can be reduced. Additionally, the amount of digital signal processing is relatively small. Therefore, direct conversion receiver is advantageous because of low cost and being lightness in weight. Further, it is possible to make one chip receiver if direct conversion is used.

FIG. 1 shows a block diagram of a conventional direct conversion receiver.

As shown in FIG. 1, the conventional direct conversion receiver comprises a low noise amplifier 101, a mixer 103, an amplifier 105, a filter 107, and a variable gain amplifier 109.

Low noise amplifier 101 is a variable gain amplifier. It receives radio signal via antenna to amplify the radio signal while suppressing noise. Mixer 103 mixes the output signal of low noise amplifier 101 with local oscillation signal LO and, thereby, outputs base band signal. Amplifier 105 amplifies the base band signal output from mixer 103. Filter 107 selects desired signal from the amplified signal. Variable gain amplifier 109 amplifies the output signal of filter 107 while varying the gain of the output signal in order to maintain the required power level of the output signal.

The direct conversion receiver shown in FIG. 1 has advantages of reduced exterior device and small amount of digital signal processing as described above. However, it suffers from DC offset problem resulting difficulty in being implemented in integrated circuitry.

Primary cause for the DC offset in a direct conversion receiver is the local oscillator leakage. Specifically, leakage of the input radio signal appears at one of the input of the mixer to which local oscillation signal LO is inputted. The leakage components are driven to the mixer 103 together with local oscillation signal LO. Consequently, the input radio signal is mixed with the leakage components of itself at mixer 103. Similarly, leakage of local oscillation signal LO appears at the input of the mixer to which input radio signal is inputted. The leakage components are driven to the mixer 103 together with the input radio signal. Consequently, local oscillation signal LO is mixed with the leakage components of itself at mixer 103. The mixing of signals having identical frequency characteristic results in DC offset at the output of mixer 103. The DC offset resulting from the mixing of signals having identical frequency characteristic is called DC offset by self-mixing. The quantity of DC offset by self-mixing varies continuously in accordance with power level and frequency of input radio signal and local oscillation signal LO.

Secondary cause for DC offset is mismatch of load at output terminal of mixer 103 and duty error of local oscillation signal LO being inputted to mixer 103.

The other cause for DC offset is mismatch of devices in amplifier and filters. This DC offset varies in accordance with variation of cutoff frequency of filter 107 and gain of variable gain amplifier 109.

DC offset of direct conversion receiver results from a lot of causes as described above. The amount of DC offset varies continuously in accordance with the variation of frequency of local oscillation signal, input radio signal, gain of amplifiers.

The DC offset problem is one of the major reasons causing deterioration of direct conversion receiver's performance. In this regard, there are a lot of efforts to solve the DC offset problem.

A direct conversion receiver in accordance with one of those efforts is described in U.S. patent application Ser. No. 2002/0094788 published on Jul. 18, 2002 with a title of "Signal processing semiconductor integrated circuit device and wireless communication system" by Norio Hayashi, et al. FIG. 2 shows a block diagram illustrating the direct conversion receiver described in U.S. patent application Ser. No. 2002/0094788. The direct conversion receiver comprises a dummy low noise amplifier (LNA) 112B, programmable gain amplifiers PGA1–PGA3, and low pass filters LPF1–LPF3. DC offset appearing at the output terminals of amplifiers PGA1–PGA3 is eliminated by using an automatic calibration circuit 117.

The automatic calibration circuit 117 comprises analog to digital converters 124A–124C, a register REG, digital to analog converters 125A–125C, and a counter 126. The analog to digital converters 124A–124C convert potential difference of the programmable gain amplifiers PGA1–PGA3 each into digital signals. The digital to analog converters 125A–125C gives input offsets to bring the DC offsets on the outputs thereof into zero to the differential inputs of the corresponding programmable gain amplifiers PGA1–PGA3 on the basis of the comparison results by the analog to digital converters 124A–124C. The counter 126 gives operation timing to each of the digital to analog converters 125A–125C.

According to the direct conversion receiver of FIG. 2, the dummy LNA 112B is activated during the DC offset elimination operation and, then, offsets are given to the differential inputs of the programmable gain amplifiers PGA1–PGA3 through the automatic calibration circuit 117. Consequently, DC offsets on the output terminals of the amplifiers PGA1–PGA3 are eliminated.

However, according to the direct conversion receiver of FIG. 2, DC offsets during only a time for the DC offset elimination operation are eliminated. Therefore, only the DC offsets by leakage of local oscillation signal LO are eliminated, while dynamic DC offsets such as those varying in accordance with the variation of gain of amplifiers. The dynamic DC offsets are amplified by amplifiers PGA1–PGA3, which results in the deterioration of the receiver's performance. Additionally, since a dummy LNA 112B was used instead of LNA 112A to which radio input signal is inputted during the DC offset elimination operation, those DC offsets which vary in dependent on power level variation of the received radio signal are not eliminated.

Other technologies for solving the DC offset problem were introduced by U.S. Pat. Nos. 6,225,848 and 6,114,980.

According to U.S. Pat. Nos. 6,225,848 and 6,114,980, in order to eliminate DC offset on input of a gain stage, a sign bit generator, a binary search stage, and digital to analog converter are used. The gain stage amplifies DC offset between input signals. The amplified DC offset is inputted to the sign bit generator. The sign bit generator outputs either positive or negative sign bit according to the DC offset from the gain stage. The binary search stage determines the direction to which the DC offset may be corrected. Further, according to U.S. Pat. Nos. 6,225,848 and 6,114,980, DC offset is eliminated by forming a feedback loop.

However, in order to eliminate DC offset, it is required that the LNA amplifier at front-end of the receiver should be off. Therefore, DC offset which varies in accordance with power level of radio signal could not be eliminated.

SUMMARY OF THE INVENTION

The object of the present invention is to provide a correction circuit which may eliminate DC offset in real-time base.

Another object of the present invention is to provide a correction circuit which may eliminate DC offset which varies in accordance with the variations of frequency of local oscillation signal and cut off frequency of filters.

Another object of the present invention is to provide a correction circuit which may eliminate dynamic DC offset which varies in accordance with the variations of power level of the signal inputted to a signal processing apparatus.

Another object of the present invention is to provide a DC offset correction circuit which may eliminate DC offset in a tuner itself.

According to an aspect of the present invention, a signal processing apparatus for correcting DC offset in a communication system is provided. The signal processing apparatus comprises: a low noise amplifier (LNA) 301; a mixer 303 for mixing the output from said LNA 301 with local oscillation signal LO; a first offset correction amplifier 305 for amplifying output signal from said mixer 303 and for eliminating DC offset in the output signal in accordance with first control signal Vc31; a second offset correction amplifier 309 for amplifying output signal from said first offset correction amplifier 305 and for eliminating DC offset in the output signal in accordance with second control signal Vc32; a variable gain amplifier 311 for amplifying output from said second offset correction amplifier 309 wherein gain is controlled such that power level of output be maintained to a desired value; offset calibration mean 313 for calibrating DC offset in output from said variable gain amplifier 311; and offset correction mean 315 for outputting the first and second control signals Vc31 and Vc32 in accordance with the output from said offset calibration mean 313, to eliminate DC offset in the output from said variable gain amplifier 311.

According to another aspect of the present invention, a signal processing apparatus is provided, which comprises: a LNA 331; a mixer 333 for mixing the output from said LNA 331 with local oscillation signal LO; a first variable gain amplifier 337 for amplifying output from said LNA 331 while controlling the gain thereof; means connected to output of said first variable gain amplifier 337 for eliminating DC components in the output from said first variable gain amplifier 337; an offset correction amplifier 339 for amplifying output from said means for eliminating DC offset in the output in accordance with a first control signal; a second variable gain amplifier 341 for amplifying output from said offset correction amplifier 339 while controlling the gain thereof; offset calibration mean 343 for calibrating DC offset in output from said second variable gain amplifier 341; and offset correction mean 345 for outputting the control signal in accordance with output from said offset calibration mean 343, to eliminate DC offset in the output from said variable gain amplifier 341.

According to another aspect of the present invention, a signal processing apparatus is provided, which comprises: an offset correction amplifier for amplifying signals received to first and second input terminal differentially to output through first and second output terminals, respectively, and for eliminating DC offset in the received signals in accordance with a offset control signal; a variable gain amplifier for amplifying output of said offset correction amplifier while controlling gain thereof; offset calibration means for calibrating DC offset in output from said variable gain amplifier; and offset correction means for outputting the offset control signal for correcting DC offset calibrated by said offset calibration means.

According to another aspect of the present invention, a method for correcting DC offset in a signal processing apparatus is provided, which comprises steps of: activating the signal processing apparatus; setting initial data for correcting DC offset; sensing whether either frequency of PLL or cutoff frequency of LPF is changed; correcting DC offset, when a change is sensed in the sensing step, and determining the correction data from MSBs to LSBs n a successive approximation method; and correcting DC offset, when a change is not sensed in the sensing step or the correcting step is completed, by calibrating DC offset in a real time base and increasing or decreasing the correction data pursuant to the calibrated DC offset.

According to another aspect of the present invention, a method for correcting DC offset in a signal processing apparatus is provided, which comprises steps of: activating the signal processing apparatus; setting initial data for correcting DC offset; correcting DC offset and determining the correction data from MSBs to LSBs n a successive approximation method; and correcting DC offset by calibrating DC offset in a real time base and increasing or decreasing the correction data pursuant to the calibrated DC offset.

DETAILED DESCRIPTION

Hereinafter, preferred embodiments of the present invention will be described in detail with reference to the attached drawings. Although the preferred embodiments are described herein with respect to direct conversion receivers, the concept of the present invention should not be limited to the direct conversion receivers. The gist of the present invention may also be applicable to any signal processing apparatus which suffers from DC offset, such as, super-heterodyne receivers.

Constitution of Entire Circuit

Figure 3:
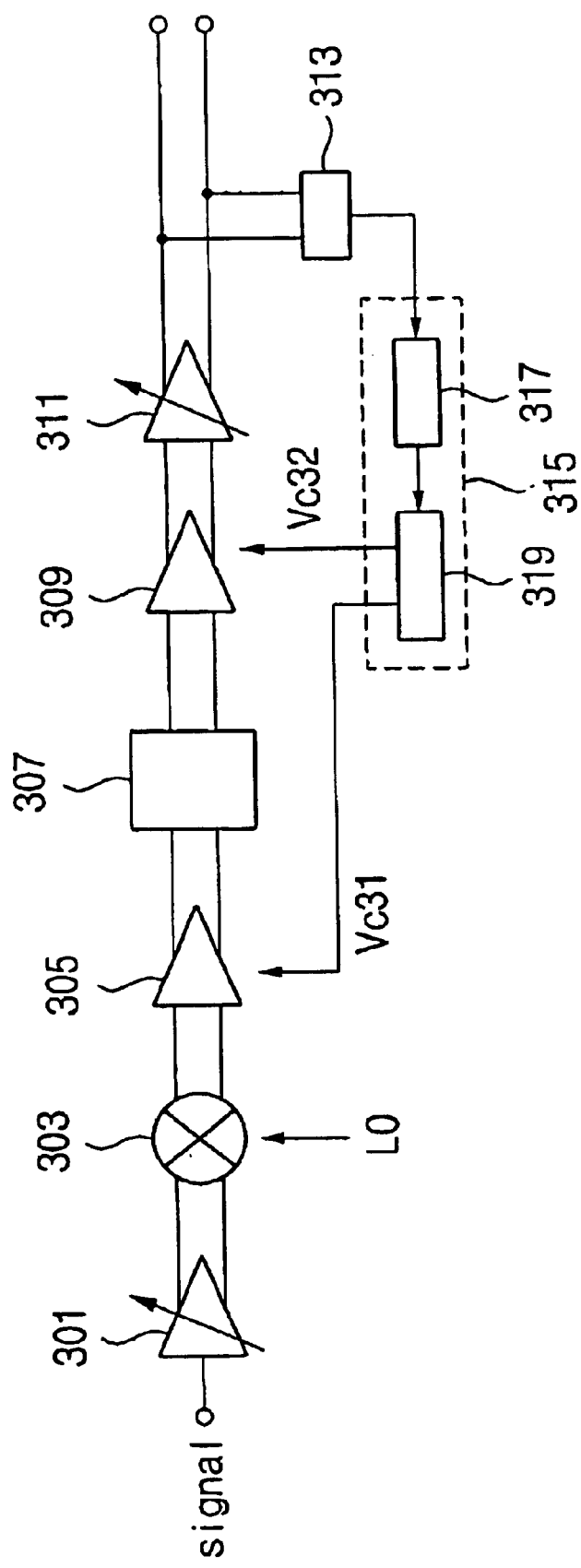
FIG. 3 shows a block diagram of an embodiment of a direct conversion receiver according to the present invention.

FIG. 3 shows a block diagram of an embodiment of a direct conversion receiver according to the present invention.

As shown in FIG. 3, a direct conversion receiver in accordance with an embodiment of the present invention comprises: a low noise amplifier (LNA) 301; a mixer 303; first and second offset correction amplifiers 305 and 309; a filter 307; a variable gain amplifier 311; offset calibration mean 313; and offset correction mean 315.

LNA 301 either amplifies or attenuates received signal from antenna while suppressing noise in the received signal. LNA 301 may be a variable gain amplifier. The gain may be controlled by an automatic gain control (AGC) which is not shown in FIG. 3.

Mixer 303 mixes the output from LNA 301 with local oscillation signal LO to output base-band signal.

The first offset correction amplifier 305 amplifies output from mixer 303. The first correction amplifier 305 eliminates DC offset in the signal in accordance with the first control signal Vc31.

Filter 307 filters output from the first offset correction amplifier 305 to output desired signal. Typically, the filter 307 may be a low pass filter. The filter 307 may be implemented either internal or external to a chip.

In FIG. 3, the filter 307 is shown to be connected to and filter the output of the first offset correction circuit 305. However, the connectivity of the filter 307 may be changed without being deviated from the gist of the present invention.

The second offset correction amplifier 309 amplifies the output from the filter 307. The second correction amplifier 309 eliminates DC offset in the signal in accordance with the second control signal Vc32.

Variable gain amplifier 311 amplifies the output from the second offset correction amplifier 309. The gain is controlled by the automatic gain control apparatus such that power level of output signal be maintained to a desired value.

Offset calibration mean 313 compares the differential outputs from the variable gain amplifier 311. The offset calibration mean 313 calibrates DC offset in the differential output signals to output the result to the offset correction mean 315.

Offset correction mean 315 comprises a control unit 317 and a register 319. The offset correction mean 315 controls the first and second control signals Vc31 and Vc32, each of which is inputted to each of the first and second offset correction amplifiers 305 and 309, respectively, in accordance with output from the offset calibration mean 313, to eliminate DC offset in the output from variable gain amplifier 311.

In the offset correction mean 315 in accordance with the present invention, the first control signal Vc31 is determined by upper N bits in the register 319, and the second control signal Vc32 is determined by lower N bits in the register 319.

In accordance with another embodiment of the present invention, a switching mean, which is not shown in FIG. 3, may be connected between the second offset correction amplifier 309 and offset correction mean 315. After the switching means are shorted, DC offset occurring at the variable gain amplifier at base-band stage is determined by using lower M bits. Then, the switching means are opened, lower M bits are maintained, upper N bits are determined and, then, the lower M bits are determined. In this way, it is possible to eliminate DC offset at the output terminal of the direct conversion receiver more minutely.

In FIG. 3, two offset correction amplifiers 305 and 309 are used to eliminate DC offset in the input signal, by being controlled by two control signals Vc31 and Vc32. However, the concept of the present invention should not be limited and narrowly interpreted by the number of offset correction amplifiers.

Offset Calibration Mean

Offset calibration mean 313 compares differential output signals from variable gain amplifier 311, calibrates DC offset in the differential output signals, and outputs the result to offset correction mean 315.

In accordance with an embodiment of the present invention, the offset calibration mean 313 may be a comparator. In this case, the comparator 313 compares the differential output signals of variable gain amplifier 311, and outputs either 0 or 1 in accordance with the polarity of the comparison result. In this way, DC offset in the output signal of the variable gain amplifier 311 is calibrated.

In accordance with another embodiment of the present invention, offset calibration mean 313 may further comprise a counter connected to the output of the comparator. The comparator determines whether DC offset in the output signals of variable gain amplifiers 311 is larger than 0 or not. The counter then evaluates sampling values of the comparator's output and, outputs an average of the results.

More specifically, when sampling of 64 times is required, a counter which can count 0 to 127 is prepared. Initial count value is set to be 64. The counter monitors output of the comparator whenever sampling occurs. If the output is 0, the counter decreases the count value. If the output is 1, the counter increases the count value. After sampling of 64 times is finished, whether the count value is larger than the initial value 64 or not is determined. In this way, a maloperation which may occur when the output of the variable gain amplifier 311 is inputted to the comparator together with an undesired A.C. current is avoided.

The number and frequency of sampling of the counter may be variable. The time for which the calibration output is given to the offset correction mean 315 can be expressed as a product of the sampling frequency fs and the number of sampling N.

In accordance with an embodiment of the present invention, in order to correct DC offset more accurately, it is preferred that the gains of LNA 301 and variable gain amplifier 311 to be maximum values. In this case, if the radio input signal from antenna has high power, the base-band output signal from variable gain amplifier 311 has very high power level. Consequently, output signal from offset calibration mean 313 changes its value between 0 and 1 repeatedly.

Figure 4:
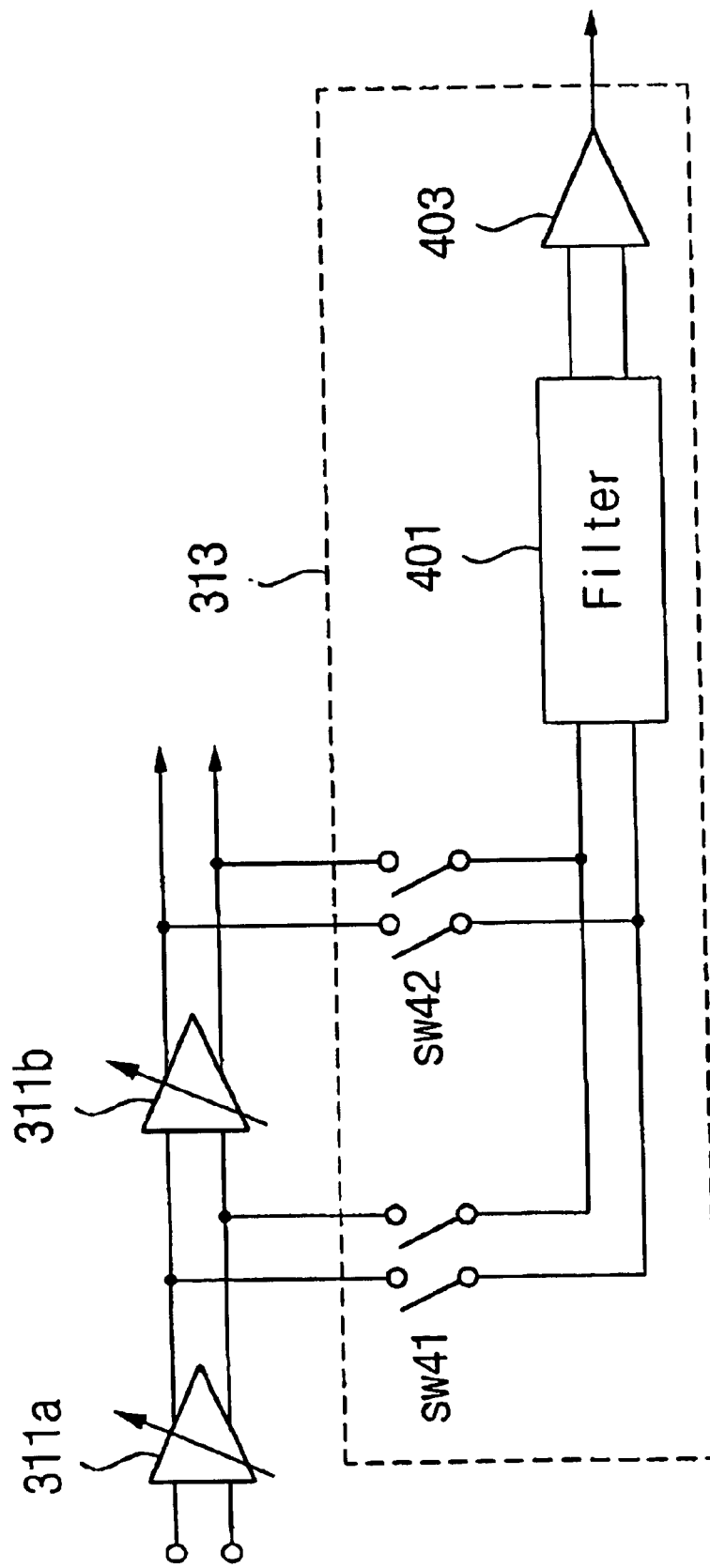
FIG. 4 shows a block diagram of an offset calibration mean in accordance with the present invention.

In order to solve this problem, as shown in FIG. 4, the offset calibration mean 313 comprises a low pass filter (LPF) 401 connected between the outputs of variable gain amplifiers 311a and 311b and the comparator 403. Further, the LPF 401 is designed to have a lower cutoff frequency. In this way, the A.C. signal may be attenuated.

According to a preferred embodiment of the present invention, the LPF 401 may be a programmable LPF whose cutoff frequency is programmable. In this case, as the cutoff frequency of LPF 401 becomes lower, more A.C. signal is attenuated. However, lower cutoff frequency results in larger transfer time. Therefore, it is preferred that a proper cutoff frequency is selected by considering the attenuation of A.C. signal and the speed of the circuit. Further, the LPF 401 may be a filter whose degree is programmable. In this case, as the degree increases, the filter 401 becomes more complicated. However, the higher degree of LPF 401 means that more A.C. signal can be attenuated. Additionally, the offset calibration mean 313 may have hysteresis characteristic. With the hysteresis characteristic, mal-operation caused by A.C. signal can be further prevented.

As a secondary solution for the A.C. signal problem, when the variable gain amplifier 311 comprises multi-stage amplifiers 311a and 311b as shown in FIG. 4, it is preferred that DC offset is calibrated from output of a variable gain amplifier stage 311a just before the final amplifier stage 311b. Otherwise, output from any amplifier stage prior to the final amplifier stage may be used to calibrate DC offset. In this case, since A.C. signals flowing to the offset calibration mean 313 become lower, the influence of A.C. signal is further attenuated.

Offset Correction Mean

Offset correction mean 315 comprises a control unit 317 and a register 319. In accordance with the output from offset calibration mean 313, the offset correction mean 315 controls the first and second control signals Vc31 and Vc32, each of which is given to each of the first and second offset correction amplifiers 305 and 309, to eliminate DC offset in the output from the variable gain amplifier 311.

Control unit 317 controls data recorded in the register 319 in accordance with the calibration output from the offset calibration mean 313. A part of or whole data in the register 319 is given to the first and second offset correction amplifiers 305 and 309 as the first and second control signals Vc31 and Vc32.

More specifically, when the offset calibration mean 313 is a comparator, control unit 317 determines whether the output from the comparator is 0 or 1 and, then, changes the data stored in register 319.

In accordance with an embodiment, the register 319 is a successive approximation register (SAR) type. In this case, the register 319 determines the data in register 319 from the most significant bit (MSB) to the least significant bit (LSB) in a successive approximation approach in accordance with the DC offset value calibrated by the offset calibration mean 313. Consequently, the DC offset value is converted to digital data.

In accordance with an embodiment, the first control signal Vc31 is comprised of the upper N bits of data in register 319. The first offset correction amplifier 305 receives the first control signal Vc31 to correct DC offset with an accuracy of N bit for the predetermined full range.

Vc32 is comprised of the lower M bits of data in register 319. The second offset correction amplifier 309 receives Vc32 to correct DC offset in the input signals of the second offset correction amplifier 309.

Preferably, the second offset correction amplifier 309 receives lower M bits of data to correct DC offset with an accuracy of M bit for the full range of 2LSB (LSB; the least significant bit) of the first offset correction amplifier 305.

The purpose for choosing the full range to be 2LSB of the first offset correction amplifier 305 is to prevent the case when DC offset is not accurately corrected by the data in register 319 by DC offset generated in 305 and 307.

Offset Correction Amplifier in accordance with an Embodiment

Offset correction amplifier in accordance with an embodiment of the present invention may be implemented by transistors. Transistor has gate (gn), source (sn), and drain (dn). Transistor has a characteristic that the current flowing from the source (sn) to drain (dn) and vice versa has its quantity and direction which is varying in dependant on the voltage driven to the gate (gn) or the voltage between the gate (gn) and source (sn). The transistor comprises conventional Bi-polar Junction Transistors (BJT), Junction Field Effect Transistors (JFET), Metal-Oxide Semiconductor Field Effect Transistors (MOSFET), and Metal Semiconductor Field Effect Transistors (MESFET).

The present invention employs a pair of complementary devices, the first and second complementary devices, such as N-type and P-type MOSFETs. Since the complementary devices are conjugate pair, the quantity and direction of the current varies in opposite relationship.

Among such a complementary device, it is known that the MOSFET shows the lowest characteristic difference between conjugate devices of almost equal size. Hereinafter, it will be set forth the description on the examples and embodiments applied to the MOSFET. However, the scope and idea of the present invention can be applied to other active devices which can constitute a complementary pair. Therefore, the concept and scope of the present invention should not be limited to the described examples and embodiments which are based on MOSFETs.

Figure 5:
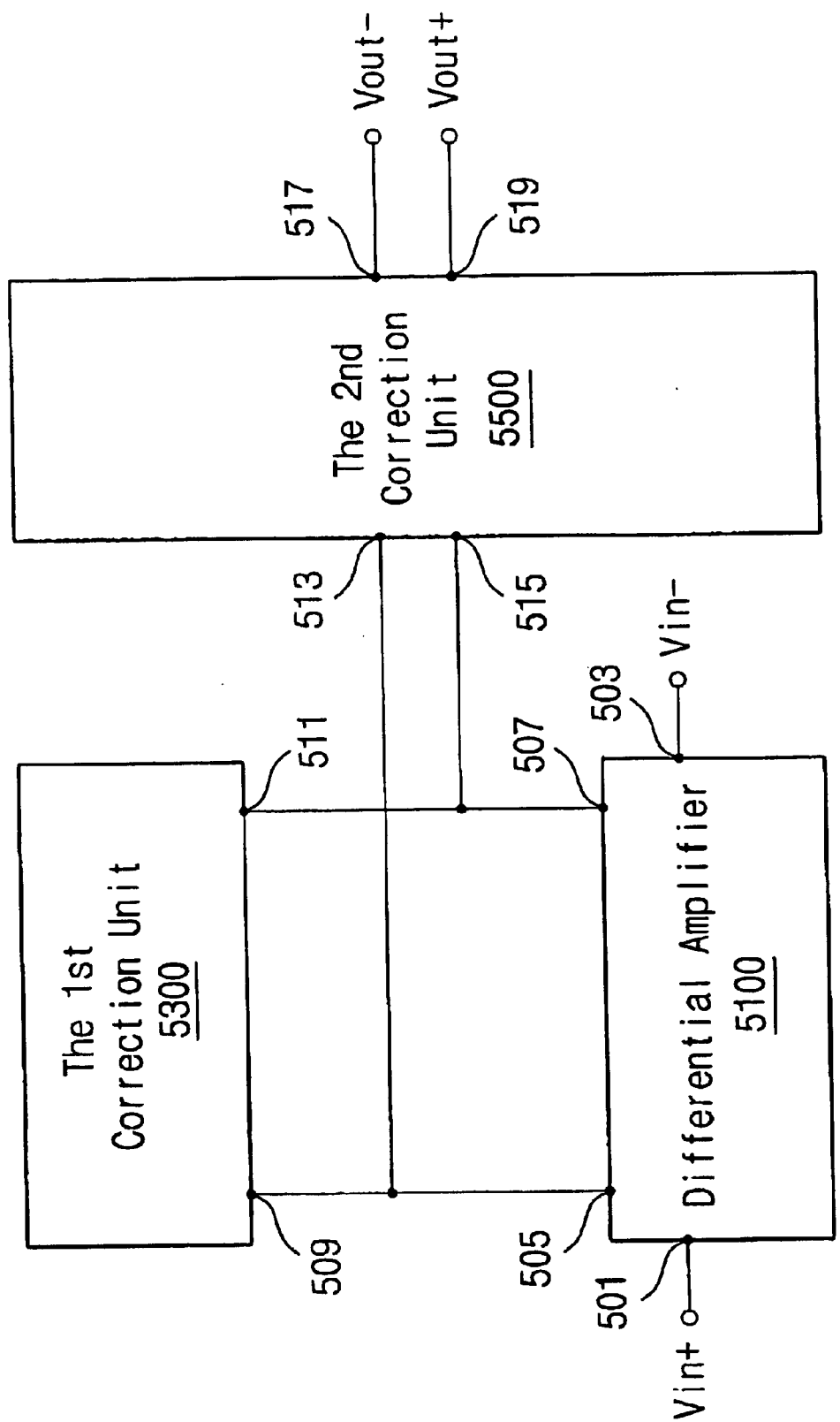
FIG. 5 shows a block diagram of an offset correction amplifier in accordance with an embodiment of the present invention.

FIG. 5 shows a block diagram of an offset correction amplifier in accordance with an embodiment of the present invention.

As shown in FIG. 5, the offset correction amplifier comprises: a differential amplifier 5100 and first and second correction units 5300 and 5500. The differential amplifier 5100 has first and second input terminals 501 and 503 and first and second output terminals 505 and 507. The differential amplifier 5100 controls current flowing out from first and second output terminals 505 and 507 according to the input voltage at first and second input terminals 501 and 503, thereby amplifying the voltage between first and second input terminals 501 and 503 and outputting amplified voltage through first and second output terminals 505 and 507. In this case, DC offset in the input signal to first and second input terminals 501 and 503 is also amplified. The amplified DC offset appears at first and second output terminals 505 and 507.

The first correction unit 5300 comprises first and second terminals 509 and 511 each of which being connected to each of first and second output terminals 505 and 507, respectively. The first correction unit 5300 eliminates DC offset appearing in signal from first and second output terminals 505 and 507 of differential amplifier 5100. In this way, first correction unit 5300 eliminates DC offset in the input signals.

Second correction unit 5500 comprises first and second input terminals 513 and 515 and first and second output terminals 517 and 519. The first input terminal 513 is connected to a connection of 505 and 509. The second input terminal 515 is connected to a connection of 507 and 511. The first and second output terminals 517 and 519 forms first and second output terminals Vout− and Vout+ of the offset correction amplifier. The second correction unit 5500 eliminates offset in the signal from first and second output terminals 505 and 507 of differential amplifier 5100 and transfers it to first and second output terminals 517 and 519. In this way, second correction unit 5500 further eliminates DC offset in the input signals.

Figure 6:
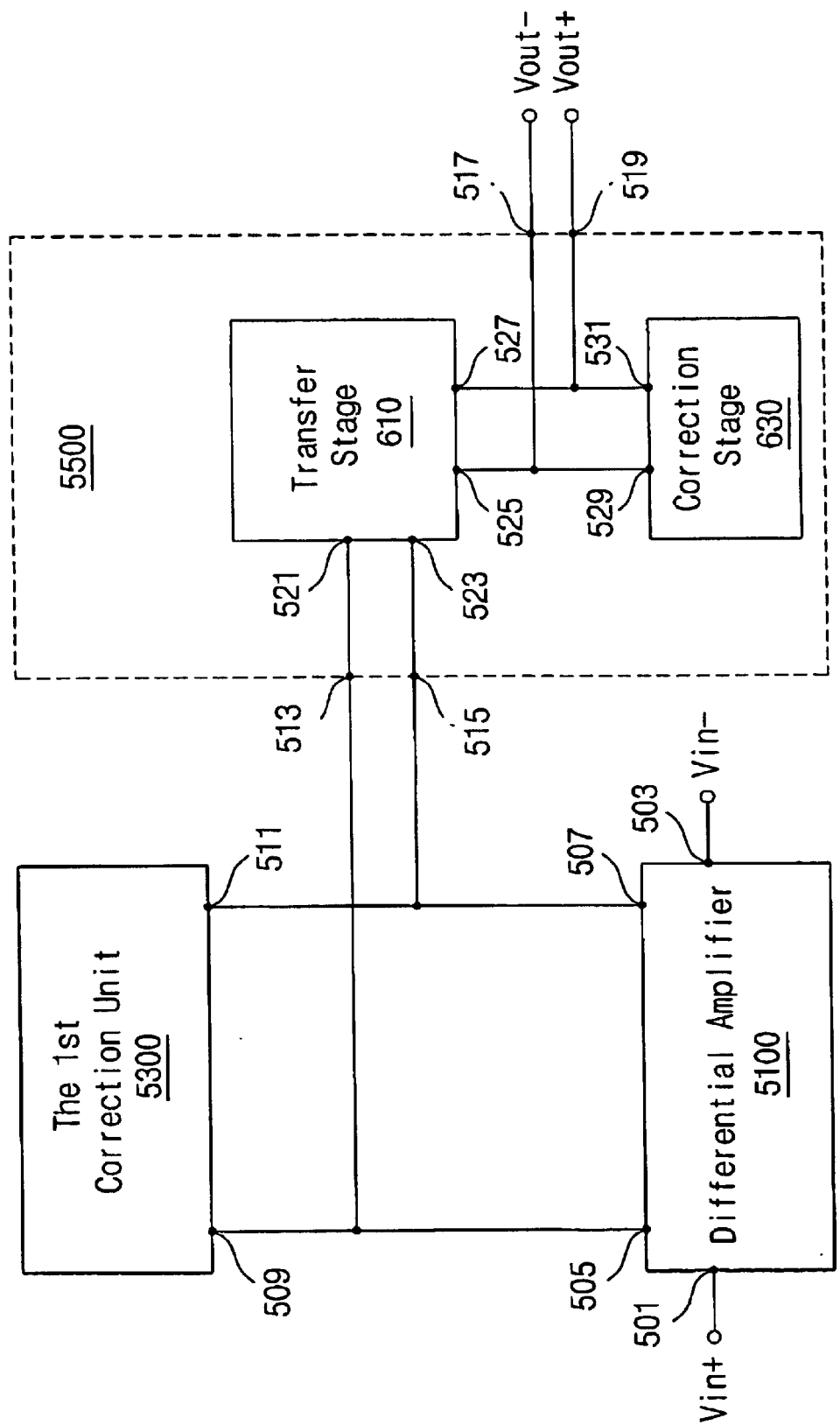
FIG. 6 shows a block diagram illustrating second correction unit 5500 of the offset correction amplifier in accordance with an embodiment of the present invention.

FIG. 6 shows a block diagram illustrating second correction unit 5500 of the offset correction amplifier in accordance with an embodiment of the present invention.

Figure 1:
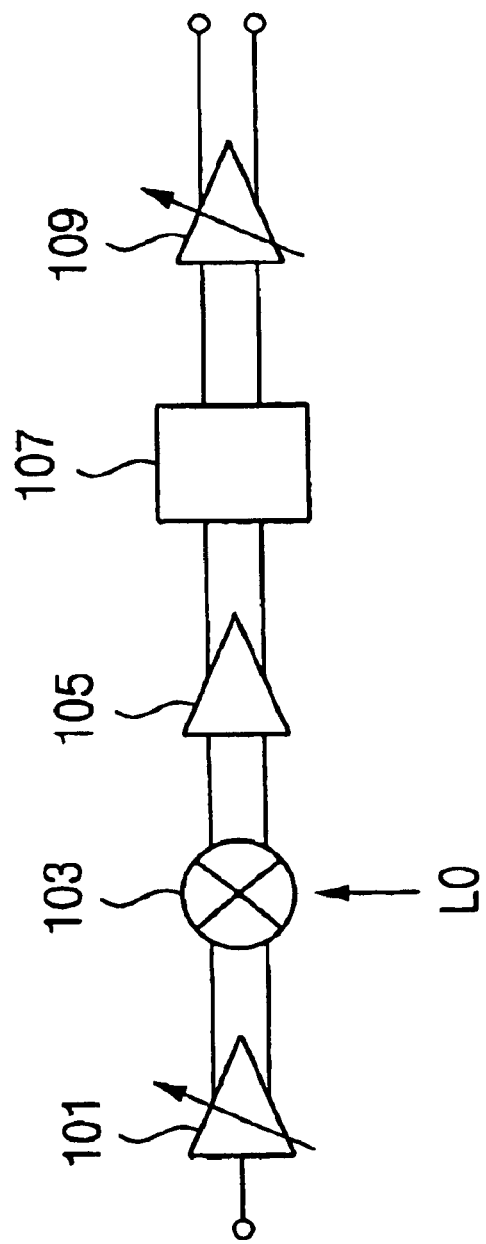
FIG. 1 shows a block diagram of a conventional direct conversion receiver.
Figure 2:
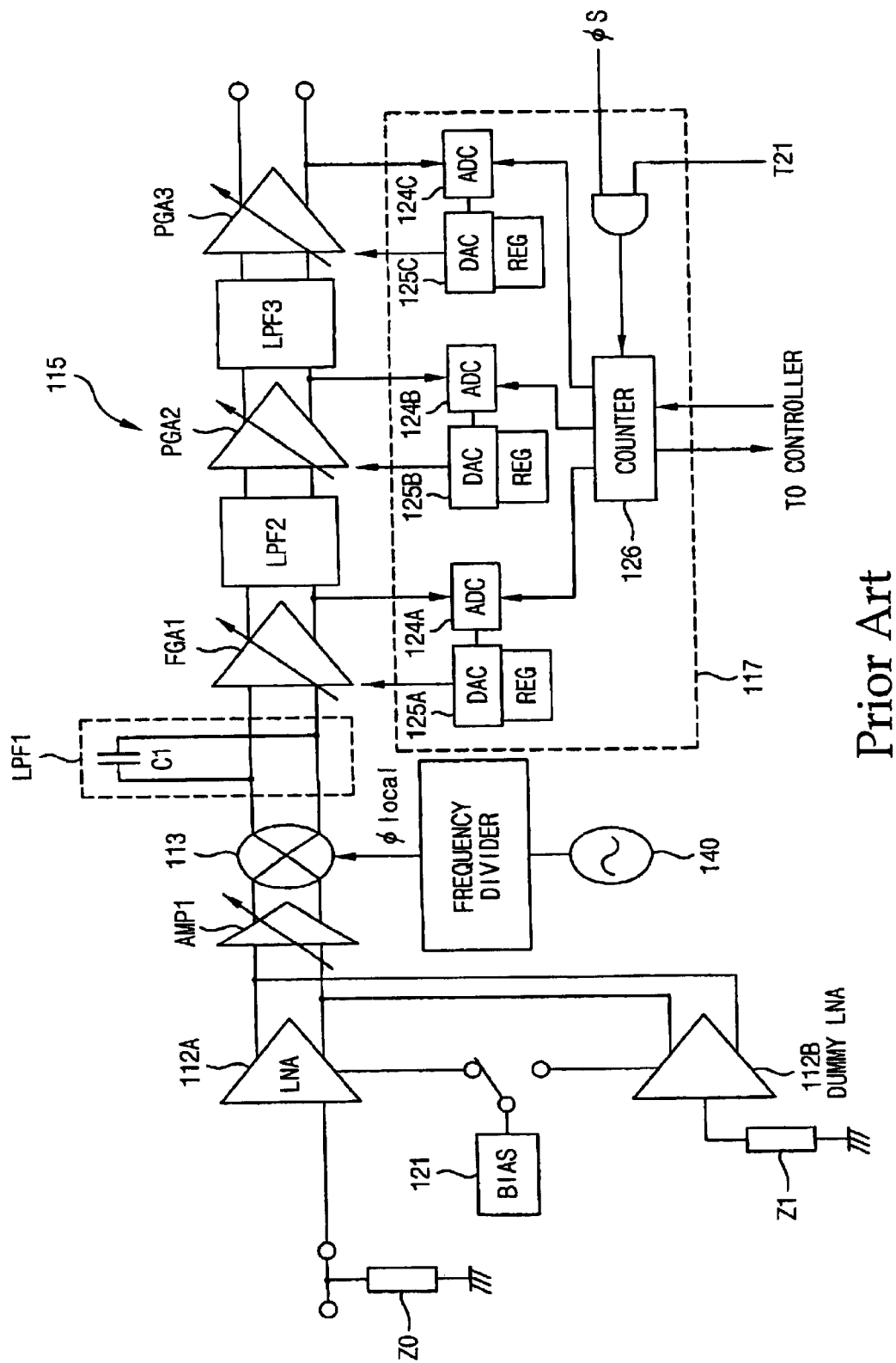
FIG. 2 shows a block diagram illustrating a conventional direct conversion receiver.

Since differential amplifier 5100 and first correction unit 5300 is the same as those in FIG. 2, detailed description for FIG. 2 is applicable.

As shown in FIG. 6, second correction unit 5500 comprises transfer stage 610 and correction stage 630. Transfer stage 610 comprises first and second input terminals 521 and 523 and first and second output terminals 525 and 527. Transfer stage 610 transfers the signal input to first and second input terminals 521 and 523 to first and second output terminals 525 and 527. The first and second input terminals 521 and 523 forms first and second input terminals 513 and 515, respectively. The first and second output terminals 525 and 527 are connected to first and second terminals 529 and 531 and form first and second output terminals 517 and 519, respectively.

Correction stage 610 comprises first and second terminals 529 and 531 and eliminates offset in the signal of first and second terminals 529 and 531.

Figure 7:
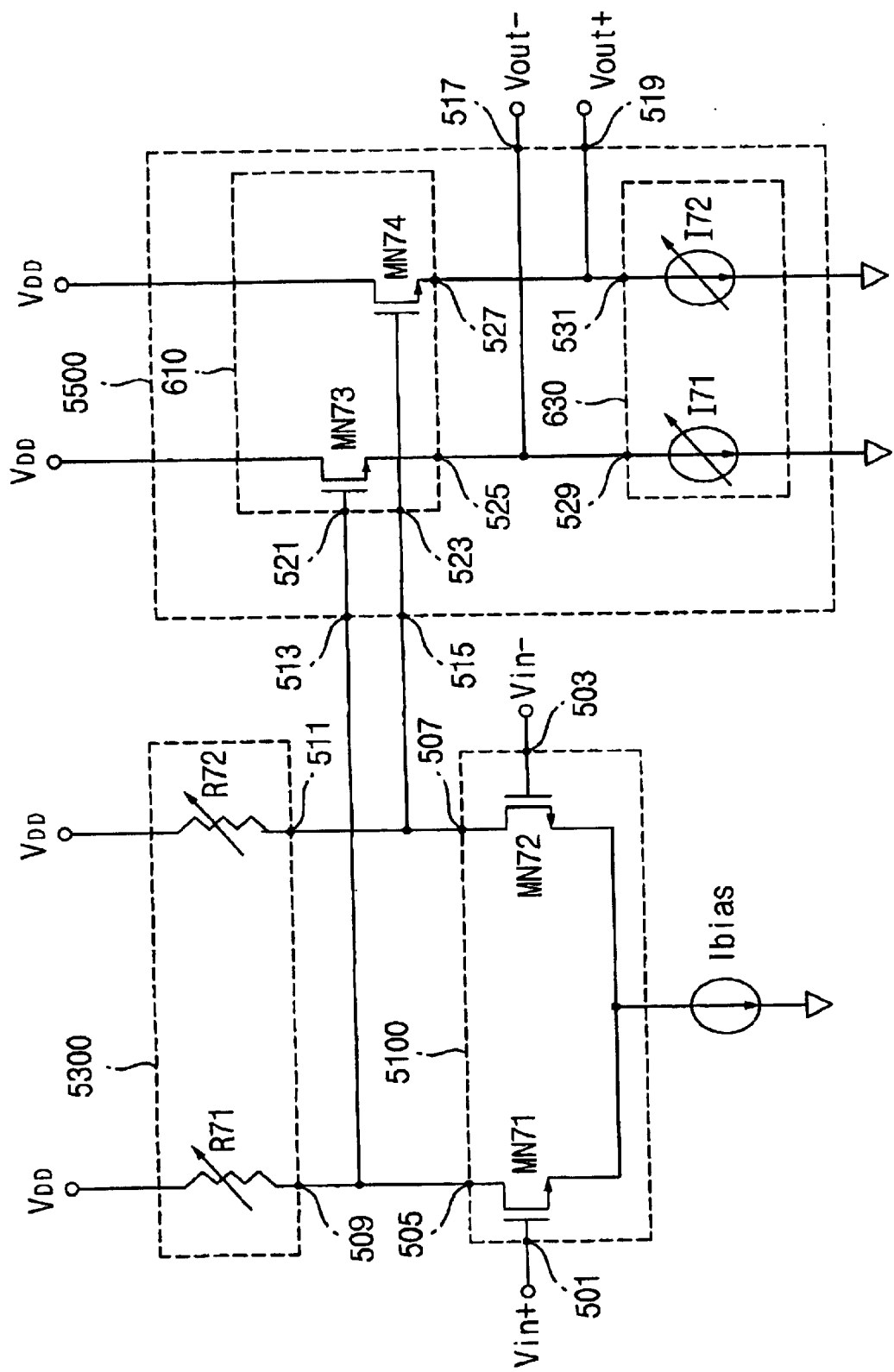
FIG. 7 shows a circuit diagram of the offset correction amplifier of FIGS. 5 and 6 which is implemented by using NMOS transistors.

FIG. 7 shows a circuit diagram of the offset correction amplifier of FIGS. 5 and 6 which is implemented by using NMOS transistors.

As shown in FIG. 7, differential amplifier 5100 comprises first and second NMOS transistors MN71 and MN72. Drains of First and second NMOS transistors MN71 and MN72 form first and second output terminals 505 and 507, respectively. Gates form first and second input terminals 501 and 503, respectively. Sources are connected to each other.

The first correction unit 5300 comprises first and second variable resistors R71 and R72. First and second variable resistors R71 and R72 are connected to voltage source VDD. The other terminals of first and second variable resistors R71 and R72 form 509 and 511, respectively.

Transfer stage 610 comprises third and fourth NMOS transistors MN73 and MN74. Drains of MN73 and MN74 are connected to VDD. Gates form first and second input terminals 521 and 523 of transfer stage 610, respectively. Sources form first and second output terminals 525 and 527, respectively.

Correction stage 610 comprises first and second variable current sources I71 and I72. Each of I71 and I72 supplies current to each of first and second terminals 529 and 531.

According to the present invention, a biasing current source $I_{bias}$ may be provided. In this case, $I_{bias}$ is connected between the connection of sources of First and second NMOS transistors MN71 and MN72 and ground.

Referring to FIG. 7, the operation of the offset correction amplifier is described.

Differential amplifier 5100 amplifiers difference of $V_{in}+$ and $V_{in}-$ input to first and second input terminals 501 and 503 and outputs amplified signal through first and second output terminals 505 and 507.

The first correction unit 5300 controls resistances of first and second variable resistors R71 and R72 to eliminate DC offset in the input signals. More specifically, first correction unit 5300 make difference between resistances of First and second variable resistors R71 and R72 larger in proportion to DC offset in the input signal to Vin+ and Vin- of the offset correction amplifier. With the difference between resistances, voltage drops of First and second variable resistors R71 and R72 become different. The resistance of R41 and R42 may be varied by digital control.

Transfer stage 610 of second correction unit 5500 transfers input voltage at first and second input terminals 521 and 523 to first and second output terminals 525 and 527.

Correction stage 610 of second correction unit 5500 controls currents flowing out of I71 and I72 to eliminate DC offset in the input signals. More specifically, second correction unit 5500 makes difference between currents from I71 and I72 in proportion to DC offset in the signal at first and second terminals 529 and 531 of correction stage 610.

In saturation mode, current-voltage relation of NMOS transistors can be expressed as follows:

$$I_{DS}=\tfrac{1}{2}\mu_n C_{OX}(W/L)(V_{GS}-V_T)^2.$$

$I_{DS}$ is current flowing from drain to source of NMOS transistor, $\mu_n$ is electron mobility, $C_{OX}$ is capacitance of gate, W is gate width, L is gate length, $V_{GS}$ is gate to source voltage, and $V_T$ is threshold voltage.

If currents from I71 and I72 vary, $V_{GS}$ of MN73 and MN74 of transfer stage 610 also vary. Consequently, D.C. input voltage values at first and second output terminals 517 and 519 vary. As shown in the above equation, the varying voltage value is proportional to a square root of the varying current value. Therefore, DC offset voltage can be corrected more minutely than first correction unit 5300 whose correction voltage is proportional to current can correcte. Further, current value from I71 and I72 can also be varied by digital control.

In order to eliminate DC offset in the input signals by using only first correction unit 5300, the difference between currents flowing through Vout− and Vout+ should be as large as a square of voltage value. However, if first correction unit 5300 and 500 are controlled by proper digital values, it is possible to eliminate offset while making currents at Vout− and Vout+ to have small difference between with each other. Consequently, linearity of the amplifier can be maintained.

Figure 8:
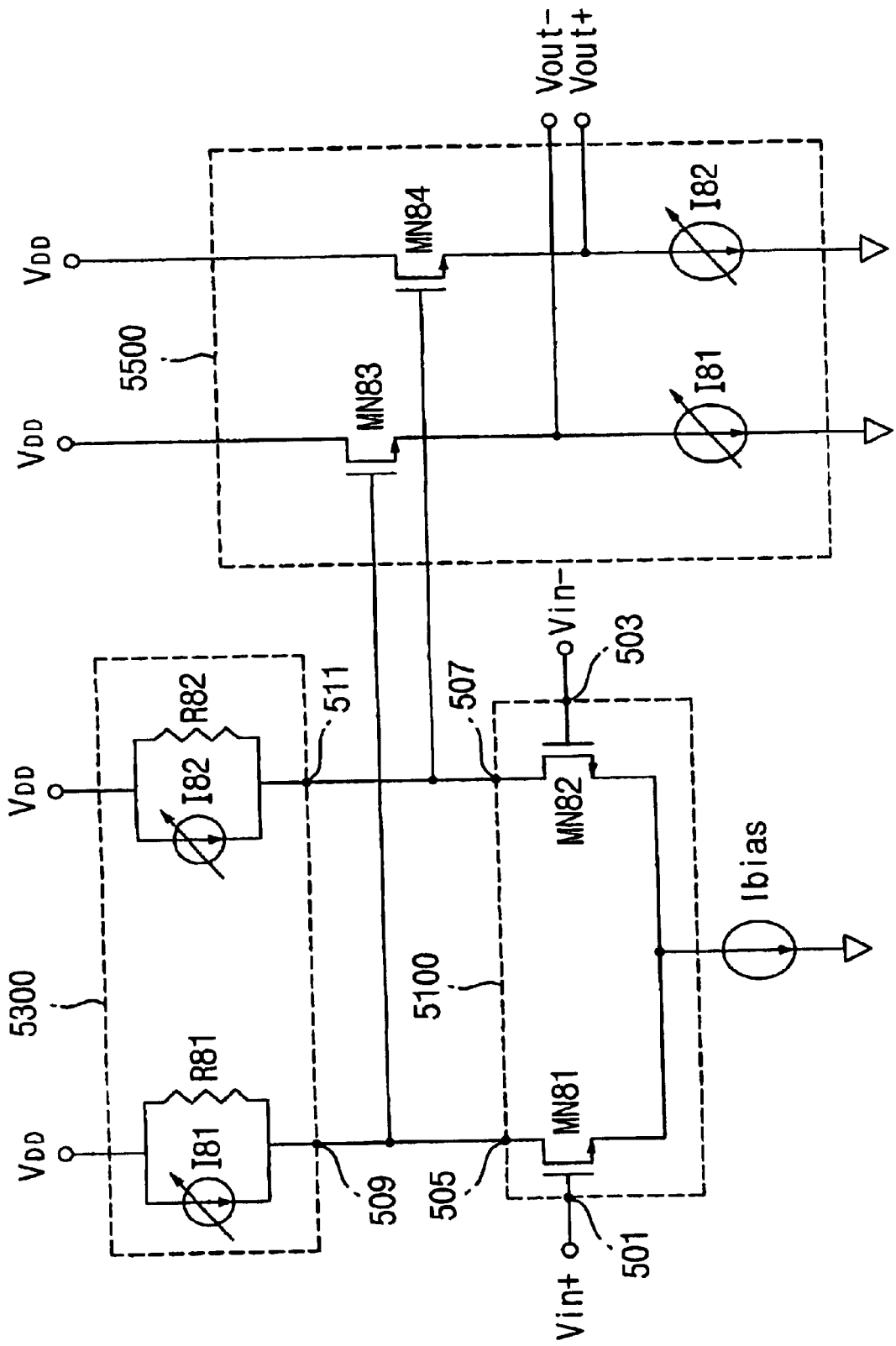
FIG. 8 shows a circuit diagram of the offset correction amplifier of FIGS. 5 and 6 which is implemented by NMOS transistors.

FIG. 8 shows a circuit diagram of the offset correction amplifier of FIGS. 5 and 6 which is implemented by NMOS transistors.

As shown in FIG. 8, the offset correction circuit of FIG. 8 is different from that of FIG. 7 in the way of implementing first correction unit 5300. According to FIG. 8, first variable resistor R71 of FIG. 7 is replaced by first variable current source I81 and first resistor R81 which are connected in parallel. Second variable resistor R72 of FIG. 7 is replaced by second variable current source I82 and second resistor R82 which are connected in parallel.

In this case, the parallel-connected I81 and R81, and I82 and R82 in FIG. 8 have functions identical to First and second variable resistors R71 and R72, respectively. More specifically, by controlling I81 and I82, offset voltage and current which are amplified by differential amplifier 5100 can be eliminated. Similarly to the previous embodiments, I81 and I82 can be controlled by digital control.

Preferably, the first and second correction unit can be digital circuits. In this case, the overall offset is eliminated by the first and second correction units with a level of M and N bits, respectively. Therefore, the overall offset elimination can be improved to a level of M+N bits. By changing the number of bits M and N, the level and degree of the elimination can also be controlled.

Preferably, offset can be roughly corrected by digital-controlling first correction unit 5300 with m bits. Then, the offset can be further corrected by digital-controlling second correction unit 5500 with n bits. In this way, more accurate correction of the overall offset can be achieved.

Operation of Compensating Offset in accordance with an Embodiment

The offset correction mean 315 provides conditional correction mode and real time correction mode.

The conditional correction mode means the operation by which DC offset in the output signal of a direct conversion receiver is corrected when either frequency of local oscillation signal LO or cut-off frequency of filter 307 changes. The real time correction mode means the operation by which DC offset in the output signal of a direct conversion receiver is corrected in a real time base.

The conditional correction mode operation is described in detail hereinafter. After that, the real time correction mode is described.

DC offset in output signal of a receiver varies pursuant to variation of either frequency of LO or cut-off frequency of filter 307. Therefore, the conditional correction mode is performed when variation of either frequency of LO or cut-off frequency of filter 307 occurs. For this operation, a sensing unit, which is not shown in figures, for sensing variation data in register which controls either frequency of LO or cut-off frequency of filter 307 is provided in the offset correction mean 315. The conditional correction mode is initiated in accordance with the output of the sensing unit.

When the conditional correction mode is initiated, offset correction mean 315 determines data in register 319 for controlling the first and second offset correction amplifiers 305 and 309 from MSBs to LSBs in a successive approximation method. More specifically, register 319 of offset correction mean 315 is initially set such that the first and second offset correction amplifiers 305 and 309 have correction values of in the middle of a full range. In this case, an output where DC offset is compensated appears at the output terminal of 311. The output is given to offset calibration mean 313. The offset calibration mean 313 calibrates DC offset in the input signal from offset calibration mean 313. The calibration results are input to offset correction mean 315. Then, register 319 of offset correction mean 315 determines the value of MSB in register 319.

For example, when offset calibration mean 313 is a comparator, if calibrated DC offset is positive value, the output of offset calibration mean 313 becomes 1. Otherwise, if calibrated DC offset is negative value, the output of offset calibration mean 313 becomes 0. Register 319 of offset correction mean 315 determines whether the output of offset calibration mean 313 is 0 or 1. If the output is 1, corresponding bit of register 319 is set to 1. Otherwise, corresponding bit of register 319 is set to 0. The other bit from the MSB to LSB is determined in the same way. In this way, the conditional correction mode is completed.

In the above, it is described that the conditional correction mode begins when either frequency of LO or cut-off frequency of filter changes. It is also preferred that the conditional correction mode is performed at least one instance independently on the change of frequency of LO or cut-off frequency in the initial stage. After that, it is preferred that the real time correction mode as set forth hereinafter is performed.

Even if the conditional correction mode as set forth above is performed, DC offset can be changed if power level of received radio signal changes. Then, control signal of the automatic gain control apparatus, resulting in the change of DC offset of 311.

In order to correct the variation of DC offset, offset correction mean 315 operates in a real time correction mode while data in register 319 which was determined by the conditional correction mode is maintained.

In the real time correction mode, varying DC offset can be corrected by either increasing or decreasing the data in register 319 by control unit 317 pursuant to DC offset calibrated by offset calibration mean 313. Preferably, register 319 of offset correction mean 315 controls register 319 from LSB to MSB.

According to the direct conversion receiver of the present invention, in order to perform the real time correction mode, register 319 further comprises an up-down counter. The up-down counter increases or decreases the value in register 319.

The direct conversion receiver in accordance with the present invention has both the conditional and real time correction modes. In this way, the direct conversion receiver can eliminate DC offset by the receiver itself. Further, DC offset can be corrected in real time, dynamic DC offset which varies in accordance with power level of input signal or gain of amplifiers.

Figure 9:
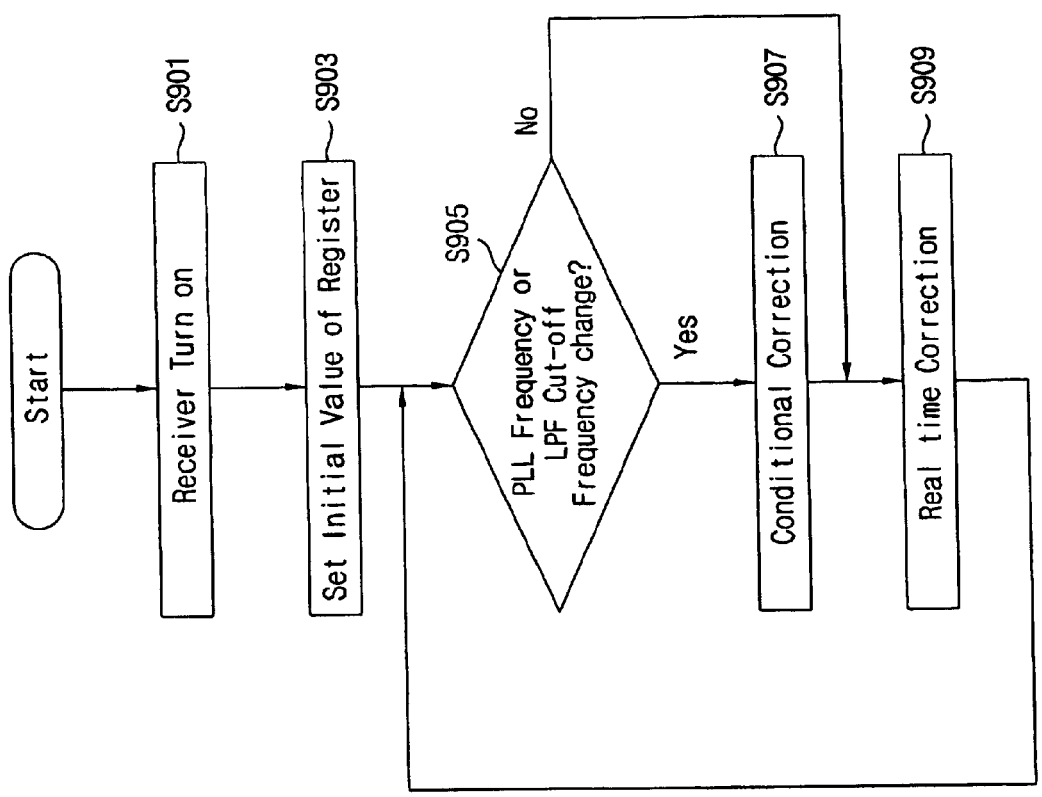
FIG. 9 shows a flow chart for explaining a method of correcting offset in accordance with the present invention.

FIG. 9 shows a flow chart for explaining a method of correcting offset in accordance with the present invention.

As shown in FIG. 9, receiver is turned on (S901). Initial value is set for register 319 of offset correction mean 315 (S903). Offset correction mean 315 senses whether data in register 319, which controls frequency of a phase locked loop (PLL) for generating LO or cut-off frequency of 307, is changed (S905).

If frequency of the PLL or cut-off frequency of 307 is changed, the offset correction mean initiates the conditional correction mode (S907). If value of all bits in register 319 is determined by the conditional correction mode, then the real time correction mode is performed while the bit values are maintained (S909). By the real time correction mode, dynamic DC offset can be eliminated.

Figure 10:
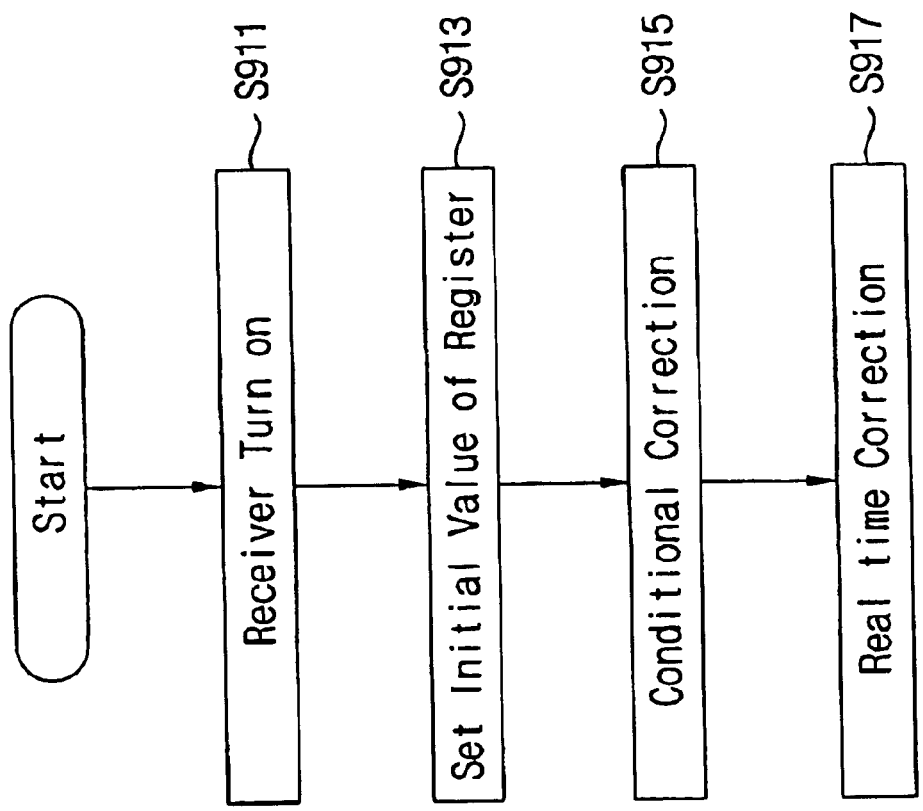
FIG. 10 shows a flow chart for explaining a method of correcting offset in accordance with another embodiment of the present invention.

FIG. 10 shows a flow chart for explaining a method of correcting offset in accordance with another embodiment of the present invention.

According to the method of FIG. 10, after the initial value is set for the register (S913), the conditional correction mode is performed (S915) regardless of change in frequency of PLL or cut-off frequency of filter. Then, real time correction mode is performed (S917).

Direct Conversion Receiver in accordance with another Embodiment

Figure 11:
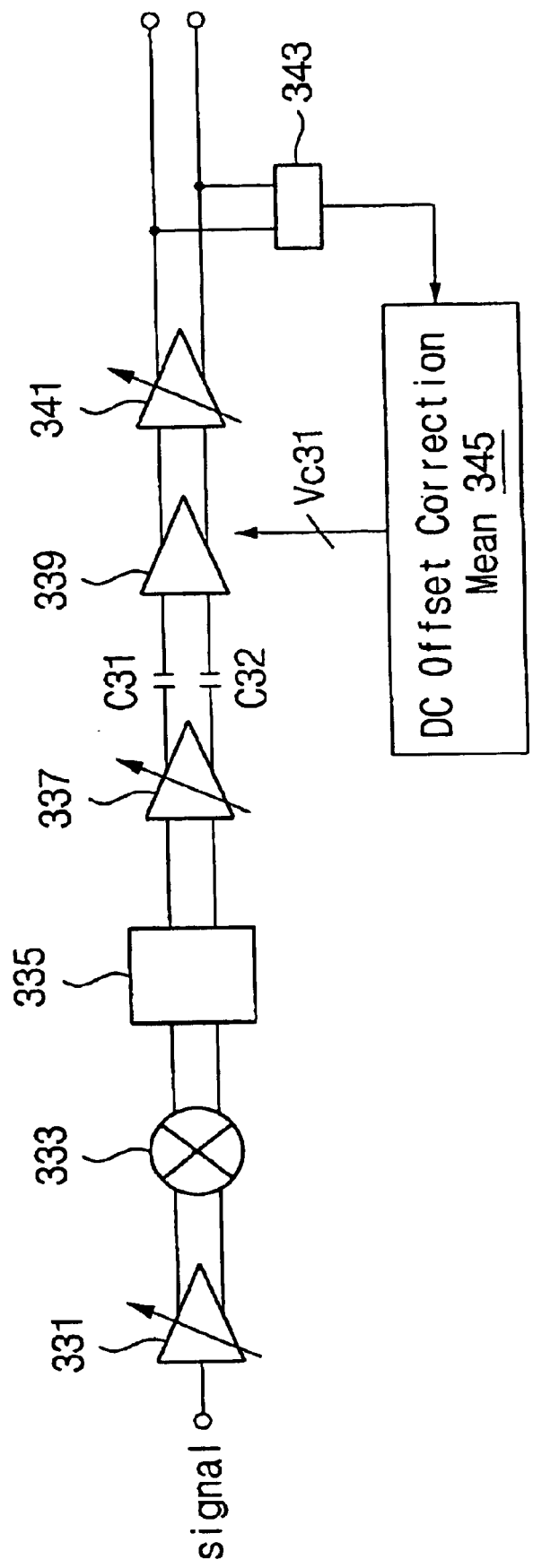
FIG. 11 shows a direct conversion receiver in accordance with another embodiment of the present invention.

FIG. 11 shows a direct conversion receiver in accordance with another embodiment of the present invention.

Referring to FIG. 11, the constitution and operation of the direct conversion receiver in accordance with the present invention will be explained. As shown in FIG. 11, the direct conversion receiver is applicable to wide band signals, such as, the direct broadcasting satellite (DBS) signals. The same element which was described in connection with FIG. 3 will be employed hereinafter.

As shown in FIG. 11, the direct conversion receiver further comprises at the output terminal of mixer 333 a filter 335, first and second variable gain amplifiers 337 and 341, first and second capacitors C31 and C32, and an offset correction amplifier 339.

The filter 335 filters desired signals from the output of 333. The first variable gain amplifier 337 amplifies the output from first variable gain amplifier 337 while controlling the gain thereof.

C31 and C32 are connected to both terminal of first variable gain amplifier 337, respectively. C31 and C32 eliminates DC components in the output from first variable gain amplifier 337 and, thereby, prevents low frequency components being transferred to offset correction amplifier 339.

The offset correction amplifier 339 amplifies the received signal. The offset correction amplifier 339 eliminates DC offset in the input signal in accordance with the first control signal Vc31 from 345.

The second variable gain amplifier 341 amplifies output from offset correction amplifier 339 while controlling the gain thereof.

As shown in FIG. 11, if DC components are rejected by using AC coupling between first and second variable gain amplifiers 337 and 341, DC offset can be corrected by using smaller number of bits since the range of offset to be corrected is decreased. However, in this case, low frequency components are lost. Therefore, the AC coupling should be employed in combination with the present invention with consideration of the applicability.

In FIG. 11, any other technique for rejecting DC components in the output of first variable gain amplifier 337 can be employed other than the C31 and C32 connected to first variable gain amplifier 337.

Figure 12:
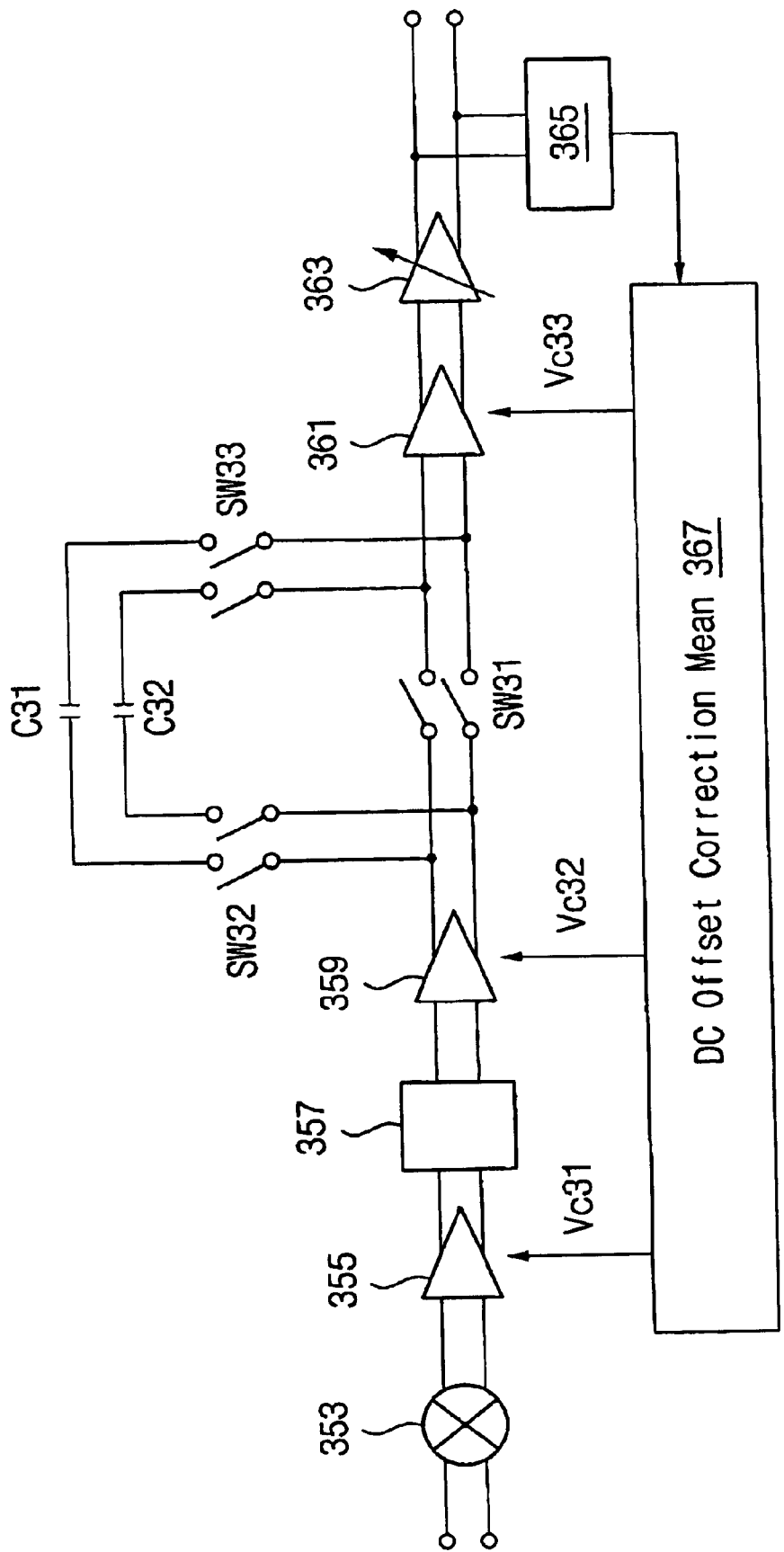
FIG. 12 shows a block diagram illustrating a direct conversion receiver in accordance with another embodiment of the present invention.

FIG. 12 shows a block diagram illustrating a direct conversion receiver in accordance with another embodiment of the present invention.

The direct conversion receiver of FIG. 12 is designed to employ the techniques of FIG. 3 and FIG. 11 selectively.

When the DC offset cancellation technique of FIG. 3 is to be employed, the first switching pair SW31 is shorted and the second and third switching pairs SW32 and SW33 are opened. Therefore, the amplified signal from 355 and 359 is given to the third offset correction amplifier 361.

In this case, offset correction mean 367 outputs The first and second control signals Vc31 and Vc32 to 355 and 359, respectively. In this way, DC offset in the output signals of variable gain amplifier 363 is eliminated. 361 amplifies output of 359.

When DC offset is to be eliminated as shown in FIG. 11, the first switching pair SW31 is opened, and the second and third switching pairs SW32 and SW33 are shorted.

The output of the second offset correction amplifier 359 is given to the third offset correction amplifier 361 via the first and second capacitors C31 and C32. The third offset correction amplifier 361 eliminates DC offset pursuant to the third control signal Vc33. In this case, the first and second offset correction amplifier 355 and 359 amplify the received signal.

The first and second capacitors C31 and C32 can be provided either external or internal to a chip. If the capacitance is large, it is preferable that the capacitors are provided in external format.

Industrial Applicability

According to the present invention, DC offset can be eliminated in a real time base. DC offset generated by the variation of frequency of LO and cut-off frequency of filters can also be eliminated.

Further, dynamic DC offset which is caused by variation of power level of the input signal may also be eliminated in a real time base.

What is claimed is:

1. Signal processing apparatus comprising:
 a low noise amplifier (LNA) 301;
 a mixer 303 for mixing the output from said LNA 301 with local oscillation signal LO;
 a first offset correction amplifier 305 for amplifying output signal from said mixer 303 and for eliminating DC offset in the output signal in accordance with first control signal Vc31;
 a second offset correction amplifier 309 for amplifying output signal from said first offset correction amplifier 305 and for eliminating DC offset in the output signal in accordance with second control signal Vc32;
 a variable gain amplifier 311 for amplifying output from said second offset correction amplifier 309 wherein gain is controlled such that power level of output be maintained to a desired value;
 offset calibration mean 313 for calibrating DC offset in output from said variable gain amplifier 311; and
 offset correction mean 315 for outputting the first and second control signals Vc31 and Vc32 in accordance with the output from said offset calibration mean 313, to eliminate DC offset in the output from said variable gain amplifier 311.

2. The signal processing apparatus of claim 1, wherein said first and second offset correction amplifiers comprises respectively:
 a differential amplifier 5100 for receiving an input signal differentially, amplifying the received input signal, and outputting amplified signal through first and second output terminals 505 and 507;
 a first correction unit 5300 for eliminating DC offset appearing in outputs from the first and second output terminals 505 and 507 of said differential amplifier 5100; and
 a second correction unit 5500 connected between said first and second output terminals 505 and 507 of said differential amplifier 5100 and said first correction unit 5300, for eliminating offset in the output from said first and second output terminals 505 and 507 of said differential amplifier 5100.

3. The signal processing apparatus of claim 2, wherein said differential amplifier 5100 comprises first and second NMOS transistors MN71 and MN72, drains of said first and second NMOS transistors MN71 and MN72 form the first and second output terminals 505 and 507, respectively, gates form the first and second input terminals 501 and 503, respectively, and sources are connected to each other.

4. The signal processing apparatus of claim 2, wherein said first correction unit 5300 comprises first and second variable resistors R71 and R72, which are connected between voltage source VDD and the first and second output terminals 505 and 507 of said differential amplifier 5100, respectively.

5. The signal processing apparatus of claim 4, wherein first variable resistor R71 is formed by first variable current source I81 and first resistor R81 which are connected in parallel and second variable resistor R72 is formed by second variable current source I82 and second resistor R82 which are connected in parallel.

6. The signal processing apparatus of claim 2, wherein said second correction unit comprises:
 a first MOS transistor MN73 having a gate connected to the first output terminal 505, a drain connected to the voltage source, and a source,
 a second MOS transistor MN74 having a gate connected to the second output terminal 507, a drain connected to the voltage source, and a source, and
 first and second variable current sources each supplying currents to each sources of the first and second MOS transistors MN73 and MN74 varying in accordance with the first and second control signals I71 and I72, respectively.

7. The signal processing apparatus of claim 1,
wherein said offset correction mean 315 comprises a control unit 317 and a register 319, and
said control unit 317 controls data recorded in the register 319 in accordance with the output from said offset calibration mean 313.

8. The signal processing apparatus of claim 1 further comprising:
a filter for filtering output from said first offset correction amplifier 305 to output desired signal to said second offset correction amplifier 309.

9. The signal processing apparatus of claim 8,
wherein cutoff frequency and degree of said filter is programmable.

10. The signal processing apparatus of claim 1,
wherein said offset calibration mean 313 comprises a comparator 313 for comparing the differential output signals of said variable gain amplifier 311.

11. The signal processing apparatus of claim 10,
wherein said offset calibration mean 313 further comprises a counter connected to the output of the comparator for evaluating sampling values of the comparator's output and, outputs an average of the results.

12. The signal processing apparatus of claim 10,
wherein said offset calibration mean 313 further comprises a filter 401 connected between the outputs of said variable gain amplifiers 311a and 311b and said comparator 403 for attenuating A.C. signal.

13. The signal processing apparatus of claim 1,
wherein if said variable gain amplifier 311 comprises multi-stage amplifiers, said offset calibration mean calibrates DC offset from output of one of the amplifier stage in said multi-stage amplifiers just before the final amplifier stage in said multi-stage amplifiers.

14. The signal processing apparatus of claim 1 further comprising:
a switching mean connected between said second offset correction amplifier 309 and said offset correction mean 315.

15. The signal processing apparatus of claim 7,
wherein said register 319 is a successive approximation register (SAR) type.

16. The signal processing apparatus of claim 1,
wherein said offset correction mean 315 comprises a sensing unit for sensing variation data in register which controls either frequency of LO or cut-off frequency of filter 307.

17. The signal processing apparatus of claim 7,
wherein said offset correction mean 315 further comprises an up-down counter for increasing or decreasing value in said register 319.

18. Signal processing apparatus comprising:
a LNA 331;
a mixer 333 for mixing the output from said LNA 331 with local oscillation signal LO;
a first variable gain amplifier 337 for amplifying output from said LNA 331 while controlling the gain thereof;
means connected to output of said first variable gain amplifier 337 for eliminating DC components in the output from said first variable gain amplifier 337;
an offset correction amplifier 339 for amplifying output from said means for eliminating DC offset in the output in accordance with a first control signal;
a second variable gain amplifier 341 for amplifying output from said offset correction amplifier 339 while controlling the gain thereof;
offset calibration mean 343 for calibrating DC offset in output from said second variable gain amplifier 341; and
offset correction mean 345 for outputting the control signal in accordance with output from said offset calibration mean 343, to eliminate DC offset in the output from said variable gain amplifier 341.

19. The signal processing apparatus of claim 18,
wherein said means for eliminating DC components in the output from said first variable gain amplifier 337 comprises a capacitor.

20. Signal processing apparatus comprising:
an offset correction amplifier for amplifying signals received to first and second input terminal differentially to output through first and second output terminals, respectively, and for eliminating DC offset in the received signals in accordance with a offset control signal;
a variable gain amplifier for amplifying output of said offset correction amplifier while controlling gain thereof;
offset calibration means for calibrating DC offset in output from said variable gain amplifier; and
offset correction means for outputting the offset control signal for correcting DC offset calibrated by said offset calibration means.

21. Method for correcting DC offset in a signal processing apparatus comprising steps of:
activating the signal processing apparatus;
setting initial data for correcting DC offset;
sensing whether either frequency of PLL or cutoff frequency of LPF is changed;
correcting DC offset, when a change is sensed in the sensing step, and determining the correction data from MSBs to LSBs n a successive approximation method; and
correcting DC offset, when a change is not sensed in the sensing step or the correcting step is completed, by calibrating DC offset in a real time base and increasing or decreasing the correction data pursuant to the calibrated DC offset.

22. Method for correcting DC offset in a signal processing apparatus comprising steps of:
activating the signal processing apparatus;
setting initial data for correcting DC offset;
correcting DC offset and determining the correction data from MSBs to LSBs n a successive approximation method; and
correcting DC offset by calibrating DC offset in a real time base and increasing or decreasing the correction data pursuant to the calibrated DC offset.

* * * * *